United States Patent
Ono et al.

(10) Patent No.: US 6,908,311 B2
(45) Date of Patent: Jun. 21, 2005

(54) CONNECTION TERMINAL AND A SEMICONDUCTOR DEVICE INCLUDING AT LEAST ONE CONNECTION TERMINAL

(75) Inventors: Atsushi Ono, Yamatokoriyama (JP); Takuro Asazu, Nara (JP); Shinji Yamaguchi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/422,749

(22) Filed: Apr. 25, 2003

(65) Prior Publication Data

US 2003/0203661 A1 Oct. 30, 2003

(30) Foreign Application Priority Data

Apr. 26, 2002 (JP) ........................ 2002-127573

(51) Int. Cl.[7] .............................................. H01R 12/00
(52) U.S. Cl. ........................ 439/65; 439/884; 438/689
(58) Field of Search .......................... 439/65, 884–887; 438/689, 617–622

(56) References Cited

U.S. PATENT DOCUMENTS 6,022,751 A * 2/2000 Shindo et al. ................ 438/21

6,475,897 B1 * 11/2002 Hosaka ........................ 438/617
2001/0046011 A1 * 11/2001 Yasukawa .................... 349/113

FOREIGN PATENT DOCUMENTS

| JP | 260360/1987 | 11/1987 |
| JP | 293671/1987 | 12/1987 |
| JP | 164343/1988 | 7/1988 |
| JP | 305532/1988 | 12/1988 |
| JP | 209725/1991 | 9/1991 |
| JP | 047768/1993 | 2/1993 |
| JP | 198530/1993 | 8/1993 |
| JP | 264541/1996 | 10/1996 |
| JP | 270386/1998 | 10/1998 |

* cited by examiner

*Primary Examiner*—Michael C. Zarroli
(74) *Attorney, Agent, or Firm*—Harness, Dickey & Pierce, P.L.C.

(57) ABSTRACT

A first protection film (3) and a second protection film (4) are formed on an electrode pad (2). Bumps (5) are formed at sites where the deposited first and second protection films (3), (4) are both removed. The openings (3a) where the lower, first protection film (3) is removed are larger than the openings (4a) where the upper, second protection film (4) is removed, so that the upper, second protection film (4) has an overhanging structure. The bottom periphery of the bump (5) is formed to extend under the second protection film (4).

17 Claims, 7 Drawing Sheets

CONNECTION TERMINAL AND A SEMICONDUCTOR DEVICE INCLUDING AT LEAST ONE CONNECTION TERMINAL

FIELD OF THE INVENTION

The present invention relates to connection terminals and a manufacturing method thereof, as well as a semiconductor device using the same and a manufacturing method thereof, the terminals being provided, for example, as projecting electrodes (hereinafter, "bumps") on electrode pads to enable the semiconductor device to make electrical connections to external wires.

BACKGROUND OF THE INVENTION

Recent years have seen the advent of smaller and higher-performance electronics and increasing efforts to produce even smaller semiconductor devices having more terminals with a finer pitch. A result is rapidly increasing numbers of semiconductor chips (devices) packaged using a tape carrier (tape carrier package; hereinafter, "TCP") or flip chip bonded directly onto a substrate.

These types of packaging require a structure including connection bumps disposed on electrode pads of the semiconductor device, so as to provide connection terminals to the semiconductor device for electrical connection to external wires. Typically, a protection film is formed on the electrode pads to protect the electrode pads, and the bumps are formed on the electrode pads in openings where the protection film is removed.

Bumps are formed on an industrial scale, for example, by an electroplating process whereby Au (gold) or solder bumps are formed by electroplating or by a ball bump process whereby Au or solder balls are bonded onto pads by ultrasound.

Electroplating processes are advantageous in achieving large numbers of terminals and a fine pitch. However, problems arise where manufacturing equipment, such as a sputtering device and a photo device, is needed apart from an electroplating device, because the processes require formation of a barrier metal layer which doubles as a conductive film in electroplating and of windows for bump formation by the coating, exposure, and development of a photoresist.

Ball bump processes basically need no more manufacturing equipment than a wire bonder. However, the pad pitch has reached a limit: about 80 μm at commercial levels and about 60 μm at developmental levels. This indicates that ball bump processes are disadvantageous in achieving large numbers of terminals and a fine pitch.

Under these circumstances, an electroless plating bump process has emerged recently as a new bump formation process and will be soon used on a commercial basis. The electroless plating bump process is a method whereby the electrode pads of a semiconductor device are selectively electroless-plated. The following gives details of bump formation by the process.

The oxidation film and remaining thin film are removed from the electrode pads. Then, the electrode pads is subjected to a zincate process to replace the Al (aluminum) on the surface of the electrode pads with Zn (zinc). The electrode pads may be subjected to a palladium activation process, instead of a zincate process, to let Pd (palladium) to adhere to the surface of the electrode pads.

Next, the electrode pads are immersed in an electroless Ni (nickel) plating solution to set off an "Ni electroless plating reaction" (details follows). Ni reacts with and replaces the Zn or Pd on the surface of the electrode pads, and precipitates on the surface of the electrode pads. Then, the precipitated Ni itself acts as a catalyst (autocatalytic reaction) so that more Ni precipitates.

After the completion of Ni plating, to protect the Ni surface from oxidation, the surface is subjected to Au immersion plating to precipitate Au on the surface.

If the bumps are formed by the electroless plating bump process in this manner, no conductive film for use in plating needs to be formed using a sputtering device. No windows need to be formed in the photoresist above the bump formation sites using a photo device. Thus, investment in equipment is advantageously reduced in comparison to an electroplating process. Besides, the process utilizes a cheap major material (Ni) and exhibits a good throughput, and results in lower manufacture cost than an electroplating process forming Au bumps.

Bump formation by an electroless plating process is disclosed in, among others, Japanese Unexamined Patent Application 63-164343/1988 (Tokukaisho 63-164343, published on 7 Jul. 1988), Japanese Unexamined Patent Application 63-305532/1988 (Tokukaisho 63-305532, published on 13 Dec. 1988), Japanese Unexamined Patent Application 3-209725/1991 (Tokukaihei 3-209725, published on 12 Sep. 1991), Japanese Unexamined Patent Application 5-47768/1993 (Tokukaihei 5-47768, published on 26 Feb. 1993), and Japanese Unexamined Patent Application 8-264541/1996 (Tokukaihei 8-264541, published on 11 Oct. 1996).

Problems do exist however in a conventional arrangement of connection terminals where bumps are formed by an electroless plating process: bumps cannot made higher to allow for a finer pitch and more terminals.

Properties of electroless plating are the causes. That is, electroless plating does not open windows in the photoresist, and plating progresses horizontally too after plating becomes higher than the protection film. If bumps are made higher on fine-pitch chips with small spaces between pads, adjacent bumps may touch each other and be shorted. The apprehension places a restriction on the height of the bumps.

Of course, bumps can be made higher by narrowing the opening width of the protection film and the bump width. However, if the opening width of the protection film is reduced, the bumps adhere to the electrode pads on a reduced area, and adhesion strength decreases, which is undesirable. In other words, the opening width of the protection film has a lower limit below which sufficient adhesion strength is not guaranteed between the electrode pads and the bumps. The opening width of the protection film cannot be reduced below this lower limit.

SUMMARY OF THE INVENTION

The present invention has objectives to offer connection terminals structured so suitably to the manufacture by electroless plating which requires less investment and manufacturing cost than electroplating that bumps, even if manufactured by such an electroless plating process, are small in width near the top and great in height and provide sufficient adhesion strength between them and electrode pads.

To achieve the objectives, a connection terminal of the present invention includes: an electrode pad having layered protection films formed on a surface thereof; and a projecting electrode formed in an opening in the protection films on the electrode pad, wherein: a lower protection film has a larger opening therein than does an upper protection film; and the projecting electrode has a bottom extending under the upper protection film.

Here, the protection film is layered: i.e., lower protection film(s) and upper protection film(s). If the protection film is made up of two deposited layers, there is only one lower protection film and one upper protection film.

If the protection films are made up of 3 or more films, at least either the upper protection film or the lower protection film has a deposited film structure involving multiple layers; the protection films have an increasingly large opening from upper to lower, with the uppermost protection film having the smallest opening and the lowermost protection film having the largest opening.

The arrangement results in a structure in which the protection film are an upper protection film and a lower protection film having such an opening of a different size that the upper protection film overhangs the lower protection film. In other words, the opening in the lower protection film related to adhesion strength between the projecting electrode and the electrode pad is made relatively large, whereas the opening in the upper protection film providing a starting point for the plating to also extend horizontally in the forming of the projecting electrode by electroless plating is made relatively small.

The arrangement enables, in forming a projecting electrode by electroless plating, the projecting electrode of which the bottom is formed to fit the relatively large opening in the lower protection film to be formed to extend partly under the overhanging upper protection film. This provides an extra adhesion area, hence sufficient adhesion strength, between the projecting electrode and the electrode pad. In addition, the projecting electrode is restricted in its growth in width, but promoted in its growth in height, since the top of the projecting electrode does not start to extend horizontally until it grows out of the relatively small opening in the upper protection film.

As a result, the connection terminal allows for no short between adjacent bumps and ensures sufficient adhesion strength between the projecting electrode and the electrode pad, even if the projecting electrode is decreased in width and increased in height so that it is applicable in further pitch reduction and terminal addition.

To achieve the objectives, a method of manufacturing a connection terminal of the present invention may include the steps of: dry etching an upper protection film to form an opening therein; wet etching a lower protection film to form an opening therein; and performing electroless plating to form a projecting electrode.

As mentioned in the foregoing, the upper protection film is dry etched to form an opening, and the lower protection film is wet etched (etching progresses isotropically) to form an opening. This readily provides the overhanging structure of the upper protection film. In the opening, a projecting electrode is formed by electroless plating to manufacture the connection terminal of the present invention.

To achieve the objectives, a method of manufacturing a connection terminal of the present invention is characterized in that the method includes the steps of forming an opening in a protection film on an electrode pad having multiple layered protection films formed on a surface thereof so that an upper protection film overhangs a lower protection film and forming a projecting electrode in the opening by electroless plating As mentioned already, the opening is formed so that the upper protection film overhangs the lower protection film. Even if the projecting electrode is formed by electroless plating, the relatively large opening in the lower protection film provides an extra adhesion area, hence sufficient adhesion strength, between the projecting electrode and the electrode pad, and the relatively small opening in the upper protection film adds an extra height to the projecting electrode while restricting its horizontal expansion.

The method of manufacturing a connection terminal manufactures a connection terminal, while allowing for no short between adjacent bumps and ensuring sufficient adhesion strength between the projecting electrode and the electrode pad, even if the projecting electrode is decreased in width and increased in height so that it is applicable in furthering pitch reduction and terminal addition.

To achieve the objectives, a semiconductor device of the present invention is characterized in that it includes a connection terminal of the present invention.

As mentioned already, a connection terminal of the present invention allows for no short between adjacent bumps and ensures sufficient adhesion strength between the projecting electrode and the electrode pad, even if the projecting electrode is decreased in width and increased in height so that it is applicable in furthering pitch reduction and terminal addition. A semiconductor device of the present invention including that connection terminal is applicable in furthering pitch reduction and terminal addition.

To achieve the objectives, a method of manufacturing a semiconductor device of the present invention may include the steps of: dry etching an upper protection film to form an opening therein; wet etching a lower protection film form an opening therein; and performing electroless plating to form a projecting electrode.

As mentioned already, the upper protection film is dry etched to form an opening, and the lower protection film is wet etched (etching progresses isotropically) to form an opening. This readily provides the overhanging structure of the upper protection film. In the opening, a projecting electrode is formed by electroless plating to manufacture the semiconductor device of the present invention.

To achieve the objectives, a method of manufacturing a semiconductor device of the present invention involves, in a method of manufacturing a connection terminal, forming a projecting electrode by electroless plating in an opening in a protection film on a surface of an electrode pad, and is characterized in that the method includes, in the formation of the connection terminal, the steps of making up a layered protection film and forming the opening so that an upper protection film overhangs a lower protection film.

As mentioned already, the opening is formed so that the upper protection film overhangs the lower protection film. Even if the projecting electrode is formed by electroless plating, the relatively large opening in the lower protection film provides an extra adhesion area, hence sufficient adhesion strength, between the projecting electrode and the electrode pad, and the relatively small opening in the upper protection film adds an extra height to the projecting electrode while restricting its horizontal expansion.

The method of manufacturing a semiconductor device manufactures a semiconductor device applicable in furthering pitch reduction and terminal addition, while allowing for no short between adjacent bumps and ensuring sufficient adhesion strength between the projecting electrode and the electrode pad, even if the projecting electrode is decreased in width and increased in height so that it is applicable in furthering pitch reduction and terminal addition.

For a fuller understanding of the nature and advantages of the invention, reference should be made to the ensuing detailed description taken in conjunction with the accompanying drawings.

DESCRIPTION OF THE EMBODIMENTS

The following will describe an embodiment of the present invention in reference to FIGS. 1–7.

Figure 1:
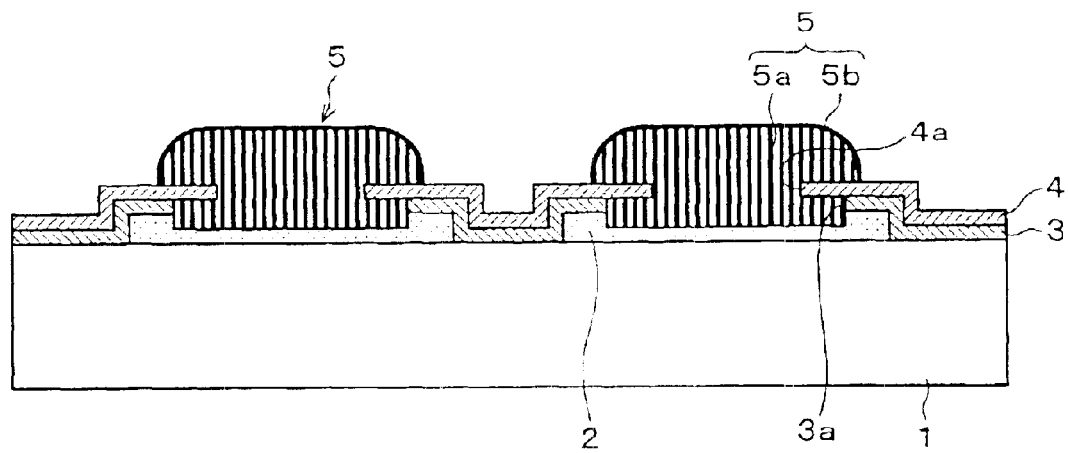
FIG. 1(a), illustrating an embodiment of the present invention, is a vertical cross-sectional view of connection terminal parts of a semiconductor device.
FIG. 1(b) is a drawing showing size relationships between openings in protection films, bumps, and electrode pads in connection terminal parts of the semiconductor device in FIG. 1(a).
Figure 1:
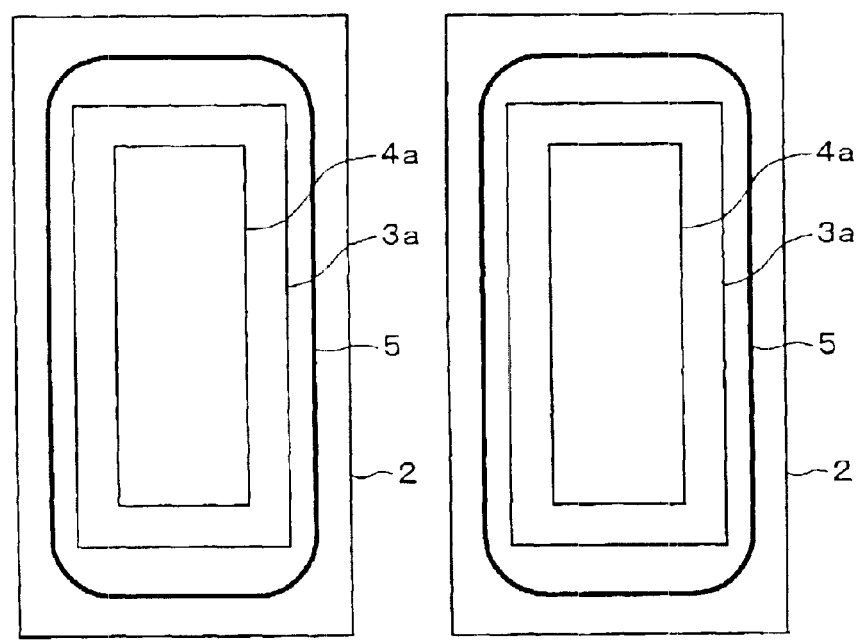

Referring to FIG. 1, an embodiment of the present invention will be described.

FIG. 1(a) shows the cross-sectional structure of connection terminal parts of a semiconductor device of the present embodiment. In the figure, 1 is a semiconductor substrate, 2 is an electrode pad, 3 is a first protection film, 4 is a second protection film, and 5 is a bump (projecting electrode).

Still referring to FIG. 1(a), there are provided an insulating film and active elements (neither shown), the electrode pads 2, the first protection film 3, and the second protection film 4 formed in this order on a semiconductor substrate 1. A bump 5 is formed in an opening 3a in the first protection film 3 and an opening 4a in the second protection film 4. Each bump 5 is made up of a bump main body 5a and a surface film 5b covering the surface of the bump main body 5.

The first and second protection films 3, 4 provide protection from external force and water to the active elements on the semiconductor substrate 1 and to wires having the electrode pads 2 on one ends. Further, the first and second protection films 3, 4 are partly removed at sites where the bumps 5 are formed, to establish good electrical connections between the electrode pads 2 and the bumps 5a.

Attention should be paid here to the overhanging structure of the first and second protection films 3, 4 and the fitting structure of the bumps 5. The opening 3a in the first protection film 3, or the lower protection film, is larger than the opening 4a in the second protection film 4, or the upper protection film, so that the second protection film 4 sticks out over the first protection film 3. The bottom, or more specifically, the bottom periphery, of the bump 5 extends under the second protection film 4.

FIG. 1(b) is a top view of FIG. 1(a), illustrating positional relationships between the openings 3a, 4a in the respective first and second protection films 3, 4, the bumps 5, and the electrode pads 2.

The structure ensures a sufficient adhesion area between the bumps 5 and the electrode pads 2 because of the large openings 3a in the lower, first protection film 3 and hence provides additional adhesion strength between the bumps 5 and the electrode pads 2, even if the bumps 5 are formed by an electroless plating process which requires less investment and manufacturing cost than an electroplating process. Besides, the openings 4a in the upper, second protection film 4 is so small that they restrict the top width of the bumps 5 and makes the bumps 5 higher.

The adhesion strength between the bumps 5 and the electrode pads 2 varies depending on the adhesion area between the bumps 5 and the electrode pads 2; the smaller the adhesion area, the less the adhesion strength. These problems are solved by forming at least two layered protection films on the electrode pads 2 and assigning individual functions to the openings 3a in the lower, first protection film 3 and the openings 4a in the upper, second protection film 4: the openings 3a are made relatively large solely to provide an extra adhesion area between the bumps 5 and the electrode pads 2 and preserve sufficient adhesion strength, whereas the openings 4a in the upper, second protection film 4 are made relatively small to prevent the bumps 5 with additional height from expanding horizontally. By so doing, the bumps 5 can be formed with such small top width and additional height that they are now applicable in furthering pitch reduction and terminal addition.

To perform such a function, the openings 3a in the first protection film 3 are appropriately smaller in size than, or equal to, the electrode pads 2 and larger in size than the openings 4a in the second protection film 4, regardless of whether the pitch between the electrode pads 2 is consistent or differs from place to place. Further, it is preferable if the openings 3a are made so that the bumps 6 exhibit an adhesion strength greater than 0.1 N. If the bumps have an adhesion strength not greater than 0.1 N, the bumps will likely come off or otherwise develop defects to a varying degree depending on the type of package and individual electrode pads.

"Adhesion strength" is a mechanical stress under which the bump breaks. Here, adhesion strength refers to shear strength measured using a bump shear tester: a tool as wide as the bump is pressed against a side of the bump to apply a load on the bump from its side, and the load value is measured when the bump breaks.

The openings 3a in the first protection film 3 are made smaller in size than, or equal to, the electrode pads 2, because otherwise the bumps 5 would expand out of the electrode pads 2 and cause the electrode pads 2 to come off.

The width of the openings 4a in the second protection film 4 may be determined to be any value taking the tradeoff between the pitch dividing neighboring electrode pads 2 and the required height of the bumps 5 into account, so long as adjacent bumps 5 are separated from each other by a distance greater than 5 μm. This is because if the bumps are formed by an electroless plating reaction with a pitch less than, or equal to, 5 μm, the metal constituting the bump main bodies precipitates between the bumps due to interaction, linking the bumps together.

The bump main body 5a of the bump 5 may be made of, for example, nickel, copper, palladium, gold, tin, or a compound containing at least one of them. The surface film 5b may be made of, for example, gold, palladium, or tin.

The upper, second protection film 4 may be, for example, a silicon nitride film, and the lower, first protection film 3 may be, for example, a silicon oxide film.

The overhanging structure is readily achieved by making the openings 4a in the second protection film 4 by dry etching and subsequently making the openings 3a in the lower, first protection film 3 by wet etching.

EXAMPLES

The present invention will be now described more specifically by means of examples.

Example 1

Figure 2:
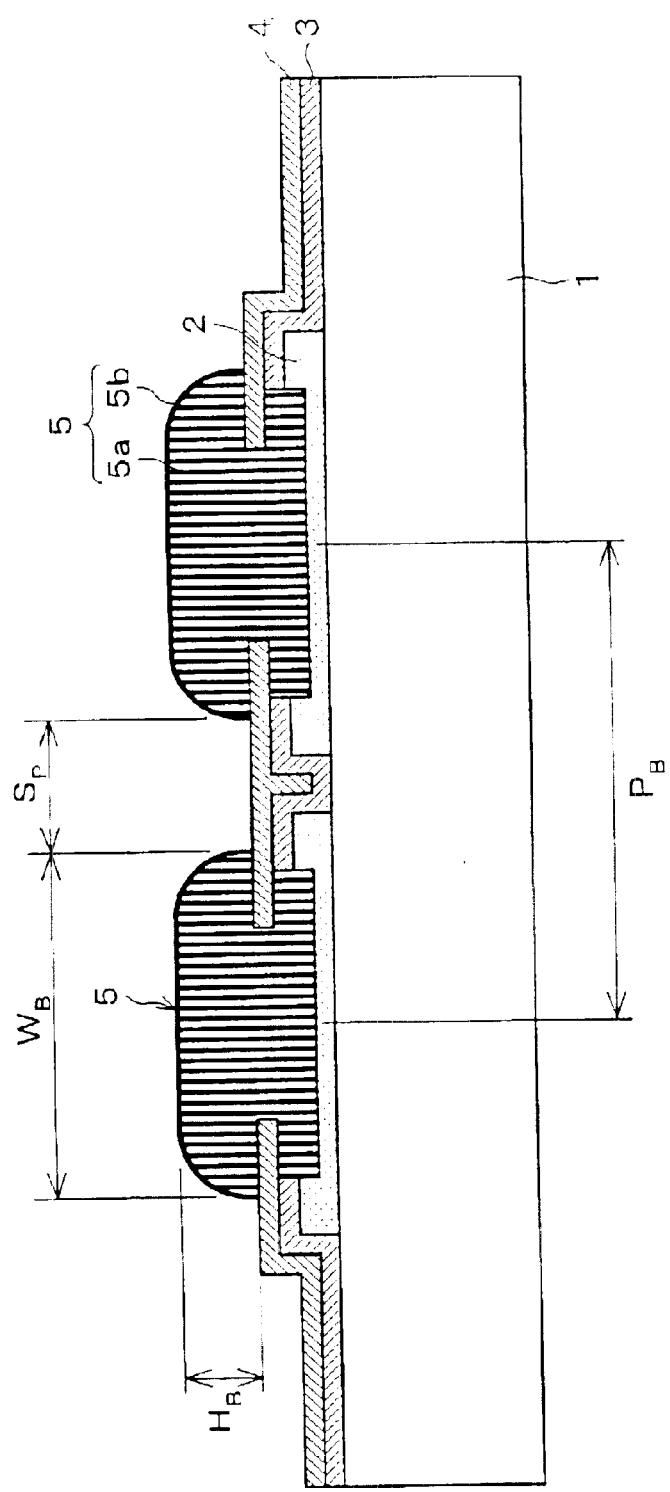
FIG. 2 is a vertical cross-sectional view of connection terminal parts of a semiconductor device as an example of the present invention.

FIG. 2 shows an arrangement of connection terminal parts of a semiconductor device as example 1. The arrangement is basically the same as the structure of the connection terminal parts described in the embodiment in reference to FIG. 1. That is, there are provided an insulating film and active elements (neither shown), electrode pads 2, a first protection film 3, and a second protection film 4 formed in this order on a semiconductor substrate 1. A bump 5 is formed in an opening 3a in the first protection film 3 on an electrode pad 2 and an opening 4a in the second protection film 4 on the first protection film 3. Each bump 5 is made up of a bump main body 5a and a surface film 5b.

In the present example, each opening 3a in the first protection film 3 measures 25 μm by 70 μm, and each opening 4a in the second protection film 4 measures 15 μm by 60 μm. The bump main bodies 5a are formed as a 10 μm high NiP layer (7–11% phosphorus), and the surface films 5b are formed as a 1-μm thick Au layer. This makes the combined height of the bump 5 11 μm. The pitch separating adjacent electrode pads 2 is 50 μm, and so is the pitch, $P_B$, separating adjacent bumps 5. The NiP bump main bodies 5a and the Au surface films 5b are formed by electroless plating.

In the arrangement, the opening 4a in the second protection film 4 is 15 μm wide. If the bump 5 is 11 μm high ($H_B$), it is 37 μm wide ($W_B$), and a standard spacing $S_B$ as large as 13 μm is secured between the bumps 5. Also, an adhesion strength of about 0.137 N is secured between the bumps 5 and the electrode pads 2. The adhesion strength value is determined from the size (adhesion area) of the openings 3a in the first protection film 3.

Figure 3:
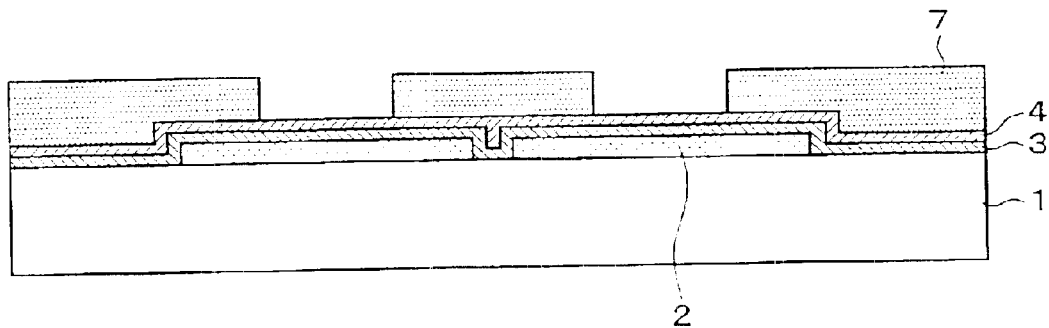
FIG. 3(a) is a vertical cross-sectional view of connection terminal parts illustrating a bump manufacturing step for a semiconductor device as an example of the present invention.
FIG. 3(b) is a vertical cross-sectional view of connection terminal parts illustrating a bump manufacturing step for a semiconductor device as an example of the present invention.
FIG. 3(c) is a vertical cross-sectional view of connection terminal parts illustrating a bump manufacturing step for a semiconductor device as an example of the present invention.
FIG. 3(d) is a vertical cross-sectional view of connection terminal parts illustrating a bump manufacturing step for a semiconductor device as an example of the present invention.
Figure 3:
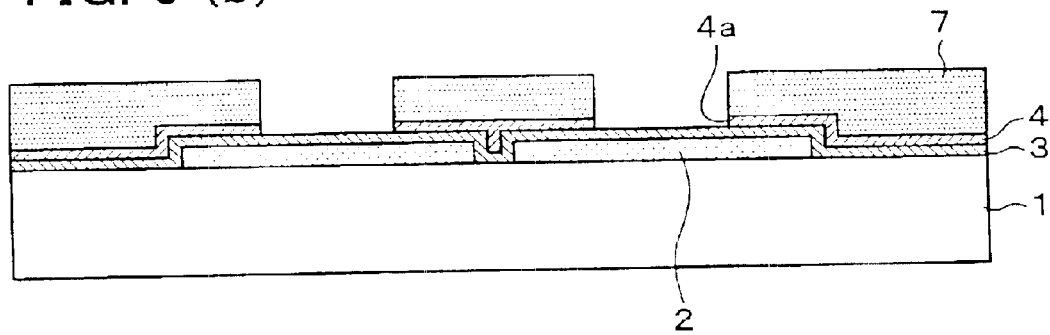
Figure 3:
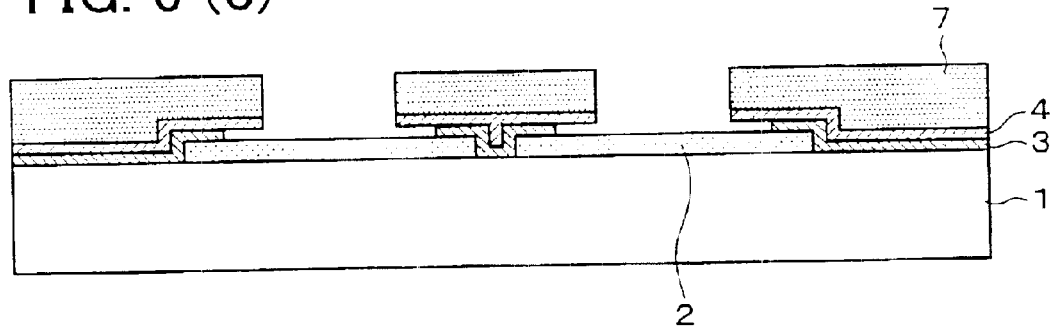
Figure 3:
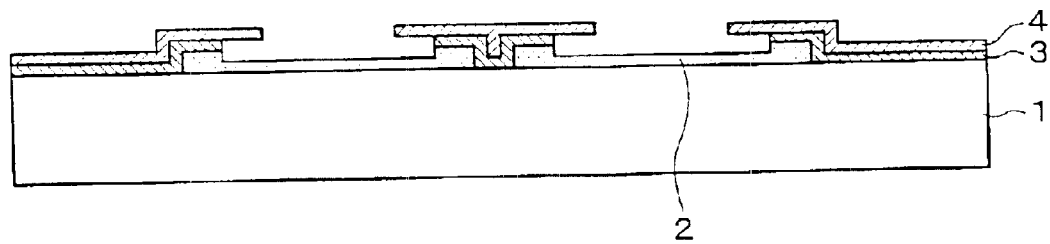
Figure 4:
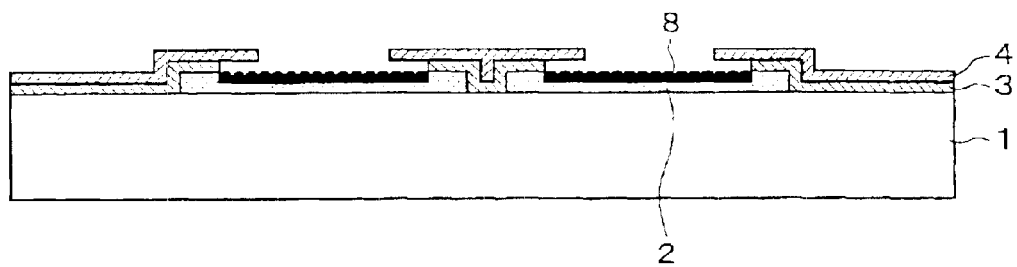
FIG. 4(a) is a vertical cross-sectional view of connection terminal parts illustrating a subsequent bump manufacturing step to those manufacturing steps in FIGS. 3(a)–3(d) for a semiconductor device as an example of the present invention.
FIG. 4(b) is a vertical cross-sectional view of connection terminal parts illustrating a bump manufacturing step for a semiconductor device as an example of the present invention.
FIG. 4(c) is a vertical cross-sectional view of connection terminal parts illustrating a bump manufacturing step for a semiconductor device as an example of the present invention.
FIG. 4(d) is a vertical cross-sectional view of connection terminal parts illustrating a bump manufacturing step for a semiconductor device as an example of the present invention.
Figure 4:
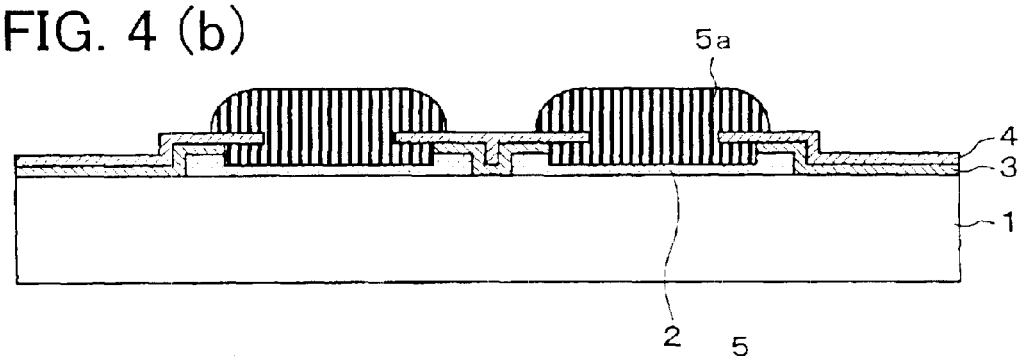
Figure 4:
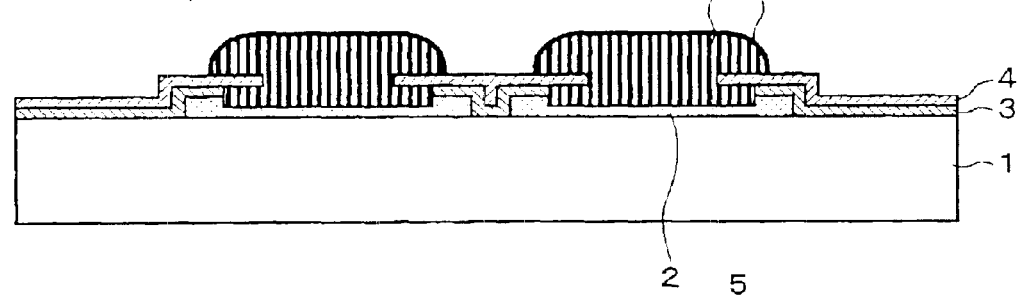
Figure 4:
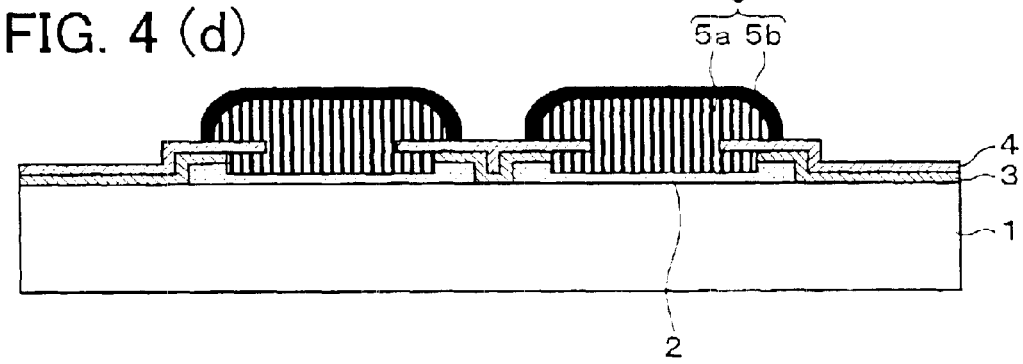

Next, referring to FIGS. 3, 4, a method of forming the electrode pads 2 and the bumps 5 will be described as an example. FIGS. 3(a)–3(d) and 4(a)–4(d) are cross-sectional views depicting steps of forming Ni bumps 5 by Ni electroless plating the electrode pads 2.

In FIGS. 3(a)–3(d) and 4(a)–4(d), 1 is a semiconductor substrate, 2 is an electrode pad, 3 is a first protection film, 4 is a second protection film, 5 is a bump, 5a is a NiP bump main body, 5b is a Au surface film, 7 is a photoresist, and 8 is a Zn layer.

First, as shown in FIG. 3(a), the photoresist 7 is applied to the semiconductor substrate 1 on which the first protection film 3 and the second protection film 4 are already formed, and windows having the same size as an opening 4a in the second protection film 4 are opened in the photoresist 7.

Here, the first protection film 3 is a silicon oxide film, and the second protection film 4 is a silicon nitride film. Alternatively, the first protection film 3 may be a polyimide or other organic film, and the second protection film 4 may be an inorganic film. Further, the first protection film 3 may be an inorganic film ($SiO_2$, PSG ($SiO_2$ doped with phosphorus), etc.), and the second protection film 4 may be a polyimide or other organic film.

Moving on to FIG. 3(b), the second protection film 4 is etched away in the windows by dry etching using a fluorine gas ($CF_4$, $SF_6$, etc.), forming the openings 4a.

The second protection film 4 can be dry etched using a fluorine gas in the same manner, be it a silicon nitride film or an inorganic film. If the second protection film 4 is a polyimide or other organic film, it is dry etched using Ar gas. If that polyimide or other organic material is photosensitive, the film 4 may be exposed and developed to remove unwanted parts of it.

Now, referring to FIG. 3(c), the first protection film 3 is etched away in the windows in the photoresist 7 by wet etching using, for example, ammonium fluoride or a mixed solution of ammonium fluoride/hydrofluoric acid.

Since wet etching is isotropic, the first protection film 3 is etched also where it is under the second protection film 4. As a result, the openings 3a in the lower, first protection film 3 grow greater than the openings 4a in the upper, second protection film 4, achieving the overhanging structure of the upper, second protection film 4.

Alternatively, both the first and second protection films 3, 4 may be wet etched to create the overhanging structure of the upper, second protection film 4.

Next, after the photoresist 7 is removed, as shown in FIG. 3(d), the semiconductor substrate 1 is immersed in an aqueous solution of, for example, sulfuric acid, phosphoric acid, or sodium hydroxide to etch away an aluminum oxide film, aluminum fluoride, etc. on the surface of the electrode pads 2. The aluminum fluoride is formed in the etching step of the first protection film 3. The aluminum oxide film is formed by heat and oxygen in air in the same step and in other steps.

After washing in water, as shown in FIG. 4(a), a Zn layer 8 is precipitated on the electrode pads 2. The Zn layer 8 protects the surface of the electrode pads 2 from another oxidation and also acts as a reaction starting point in Ni electroless plating.

The Zn layer 8 is formed by immersing the semiconductor substrate 1 from which the aluminum oxide film and aluminum fluoride are already removed in a zincate solution chiefly containing zinc oxide and sodium hydroxide to substitute the Zn in the solution for the surface Al of the electrode pads 2.

A double zincate process may be used to form a more fine Zn layer than the Zn substituted in the first round: specifically, after the Zn substitution, the semiconductor substrate 1 may be immersed in an about 5–30% aqueous solution of nitric acid to remove Zn, washed in water, and immersed again in a zincate solution.

After washing in water, as shown in FIG. 4(b), a NiP layer which will be bump main bodies 5a is formed on the electrode pads 2 by immersing the semiconductor substrate 1 with the Zn layer 8 formed thereon in a Ni electroless plating solution composed chiefly of nickel sulfate and sodium hypophosphite.

As the semiconductor substrate 1 is immersed in the Ni electroless plating solution, Ni starts replacing Zn, and the Ni electroless plating reaction proceeds with an autocatalytic reaction in which the substituted Ni acts as a catalyst.

After washing in water, as shown in FIG. 4(c), a Au layer which will be surface films 5b of the bumps 5 is formed on the NiP bump main bodies 5a by immersing the semiconductor substrate 1 with the Ni electroless plating formed thereon in a Au immersion plating solution composed chiefly of gold (1+) trisodium disulphite.

As the semiconductor substrate 1 is immersed in the Au immersion plating solution, Au starts replacing Ni. The substitution reaction stops when the Ni surface is coved with Au. In actual practice, the Ni surface is rarely covered entirely with Au with Ni continuing to elute through pin holes in the Au; the plating time is suitably 10 to 30 minutes. The Au layers 5b thus formed are 0.05–0.25 µm thick.

After washing in water, as shown in FIG. 4(d), the surface films 5b made of Au layers on the bump main bodies 5a made of a NiP layer were grown in thickness by, after the Au immersion plating, immersing the semiconductor substrate 1 in a Au electroless plating solution composed chiefly of sodium gold sulfite and a reducing agent.

This completes the Ni/Au bump formation on the electrode pads 2 by electroless plating.

The formed bumps 5 measure 11 µm in height (Ni=10 µm; Au=1 µm), are separated from adjacent ones by a distance of 13 µm, and exhibit a bump shear strength of 0.35 N/bump (cohesive failure of the Al (electrode pads 2) in breaking mode), while the electrode pads 2 has a pitch of 50 µm. These specifications indicate that the bumps 5 are formed as intended.

Figure 5:
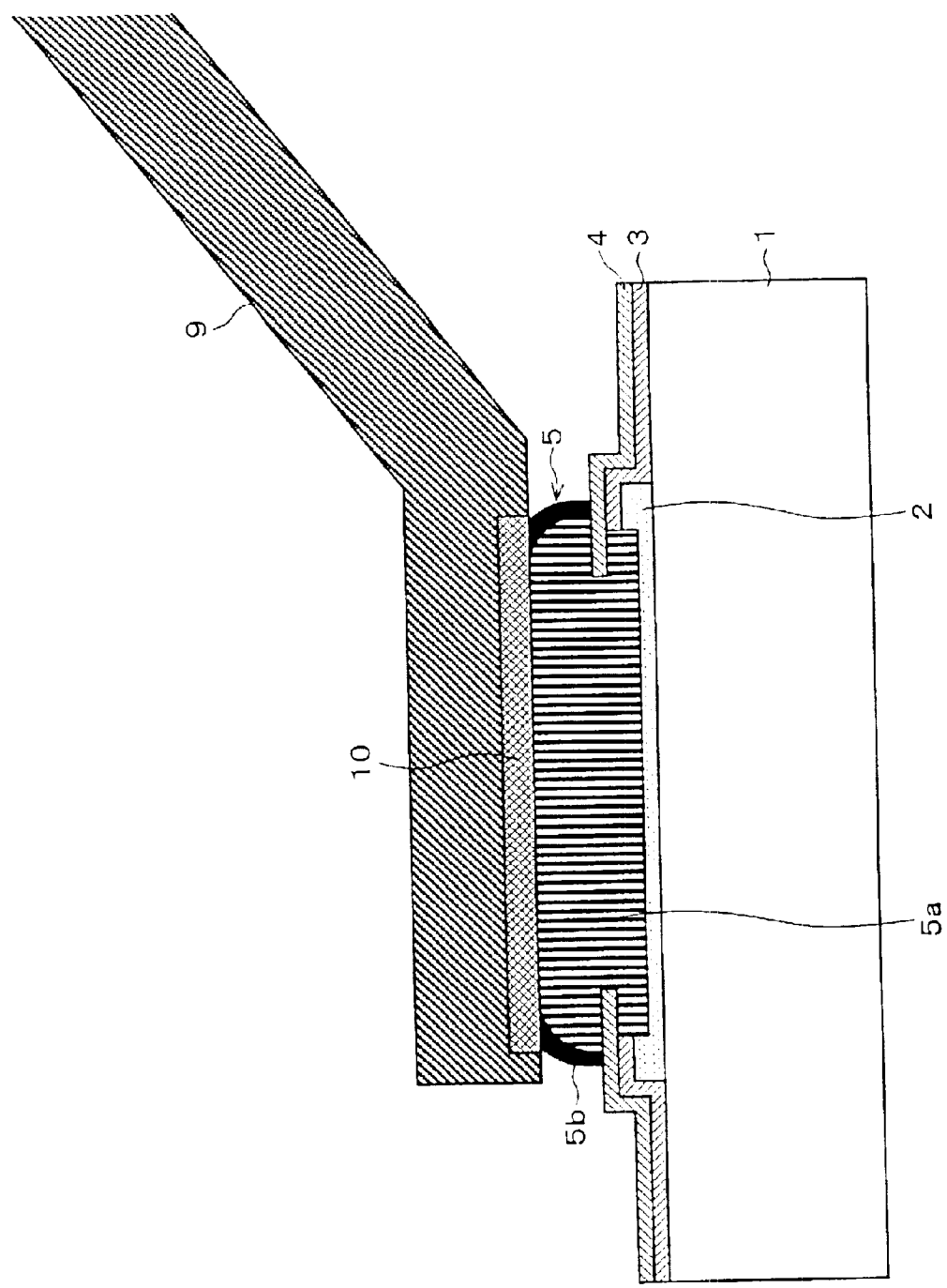
FIG. 5 is a vertical cross-sectional view showing a bonding position between, and the vicinity of, a connection terminal and a bump when a semiconductor device as an example of the present invention is packaged in a tape carrier package.

The semiconductor device of the present example is mounted to a TCP by, as shown in FIG. 5, eutectic bonding of a Sn layer plated on inner leads 9 of a tape carrier (TCP) to the Au layers as the surface films 5b on the Ni bumps 5 at bonding positions 10 and sealing with a resin.

The semiconductor device mounted to a TCP proves its high quality properties in reliability evaluation: it passed a temperature cycle test of 1000 cycles (test conditions: −40 degrees Celsius to 125 degrees Celsius, gas phase, 30 minutes for each temperature) and a pressure cooker test of 300 hours (test conditions: 110 degrees Celsius, 85 RH).

The semiconductor device of the present example can be readily packaged on wiring pads on a glass substrate or printed board with an intervening anisotropic conductive film or an anisotropic conductive paste.

Comparative Example 1

Figure 6:
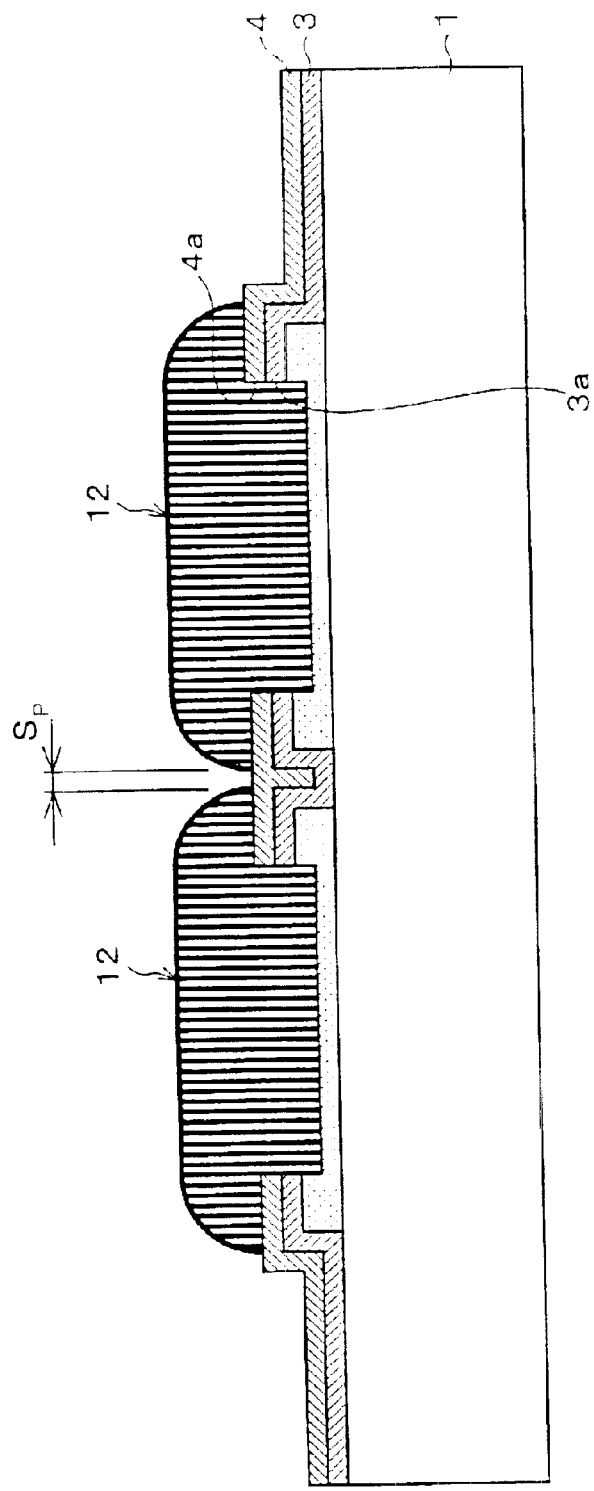
FIG. 6 is a vertical cross-sectional view of a connection terminal part of a semiconductor device as a comparative example 1 of the present invention.

FIG. 6 shows connection terminals as a first comparative example for example 1. The terminals are manufactured on a semiconductor device by exactly the same process and have exactly the same structure as those of the semiconductor device of example 1, except that in the comparative example, the openings 4a in the second protection film 4 has the same size (25 µm by 70 µm) as the openings 3a in the first protection film 3.

The structure of the connection terminals of comparative example 1 ensures the same adhesion strength between the bump 12 and the electrode pad of 0.35 N as does example 1, but can give a standard spacing between bumps 12 of only 3 µm.

As mentioned earlier, if the bump-to-bump space is 5 µm or less in an electroless plating reaction forming bumps, the metal which constitutes the bump main bodies, for example, nickel, copper, palladium, gold, tin, or a compound containing one of the elements, precipitates between the bumps due to interaction, linking the bumps together. The result is a short between the bumps.

Comparative Example 2

Figure 7:
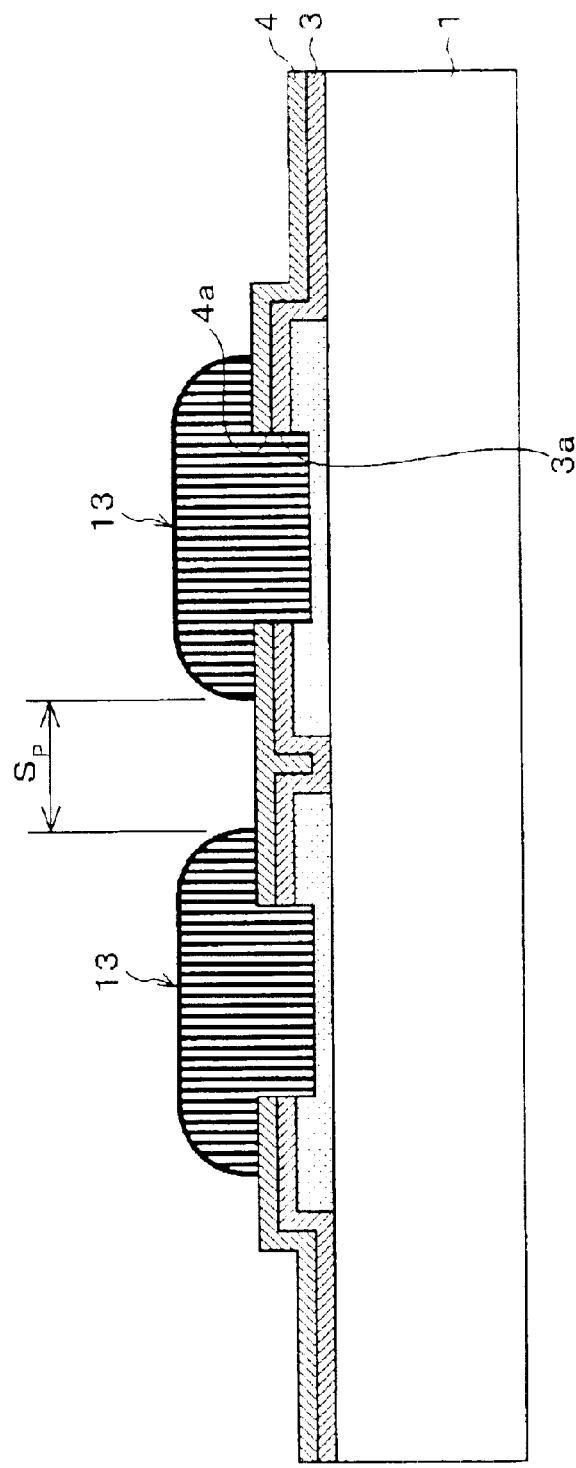
FIG. 7 is a vertical cross-sectional view of a connection terminal parts of a semiconductor device as a second comparative example of the present invention.

FIG. 7 shows connection terminals as a second comparative example for example 1. The terminals are manufactured on a semiconductor device by exactly the same process and have exactly the same structure as those of the semiconductor device of example 1, except that in the comparative example, the openings 3a in the first protection film 3 has the same size (15 µm by 60 µm) as the openings 4a in the second protection film 4.

The structure of the connection terminals of comparative example 2 ensures the same spacing between bumps 13 of 13 µm as does example 1, but can give an adhesion strength of only about 0.07 N between the bump 13 and the electrode pad.

If the bumps have an adhesion strength of 0.1 N or less, the bumps will likely come off or otherwise develop defects to a varying degree depending on the type of package and individual electrode pads.

As described so far, a connection terminal of the present invention includes: an electrode pad having layered protection films formed on a surface thereof; and a projecting electrode formed in an opening in the protection films on the electrode pad, wherein: a lower protection film has a larger opening therein than does an upper protection film; and the projecting electrode has a bottom extending under the upper protection film.

A connection terminal of the present invention may be such that the projecting electrode is made of either an element selected from the group consisting of nickel, copper, palladium, gold, and tin or a compound containing one of the elements.

Especially, nickel and copper are inexpensive and effective in reducing the cost of the element incorporating the connection terminal.

A connection terminal of the present invention may be such that the projecting electrode has a surface made of gold, palladium, or tin.

Forming the surface of the projecting electrode of either gold or tin enables eutectic bonding between the projecting electrode and another electrode.

Forming the surface of the projecting electrode of either gold or palladium enables solder bonding between the projecting electrode and another electrode.

A connection terminal of the present invention may be such that, for example, the upper protection film is made of a silicon nitride film, and the lower protection film is made of a silicon oxide film.

Forming the upper protection film of a silicon nitride film and the lower protection film of a silicon oxide film enables the upper protection film to be dry etched to form an opening and the lower protection film to be wet etched (etching progress isotropically) to form an opening. This readily provides an overhanging structure of the upper protection film.

A connection terminal of the present invention is preferably such that the opening in the lower protection film is of a size equal to, or smaller than, the electrode pad.

The opening in the lower protection film is preferably as large as possible, since it dictates adhesion area, and hence affects the adhesion strength, between the bottom of the projecting electrode and the electrode pad. However, if the opening in the lower protection film is formed larger than the size of the electrode pad, the projecting electrode extends out of the electrode pad, possibly causing electrode pad to come off and/or developing other defects. The opening in the lower protection film is therefore preferably specified to ensure sufficient adhesion strength without exceeding the size of the electrode pad.

A connection terminal of the present invention may be such that the opening in the lower protection film has such a width that the projecting electrode exhibits an adhesion strength of more than 0.1 N.

The opening in the lower protection film with such a width suppress coming-off of bumps and other defects, thus enables manufacture of a high quality connection terminal.

A connection terminal of the present invention may include a plurality of the projecting electrode and be such that the opening in the upper protection film has such a width that the projecting electrode is separated from adjacent projecting electrodes by a distance of 5 µm or greater.

The opening in the upper protection film with such a width prevents the metal forming the bump main body from precipitating between bumps and linking the bumps in the course of electroless plating forming the projecting electrodes.

A connection terminal of the present invention may be arranged to include: an electrode pad having layered protection films formed on a surface thereof; and a projecting electrode formed in an opening in the protection films on the electrode pad, wherein: an upper protection film and a lower protection film have such an opening that the upper protection film overhangs the lower protection film; and the projecting electrode sandwiches an overhanging part of the upper protection film.

The arrangement, in electroless plating forming the projecting electrode, enables the projecting electrode to be formed to have part of its bottom extending under the overhanging upper protection film and sandwich the overhanging part. This increases adhesion strength between the projecting electrode and the electrode pad. In addition, the projecting electrode is restricted in its growth in width, but promoted in its growth in height, since the top of the projecting electrode does not start to extend horizontally until it grows out of the overhanging upper protection film. The connection terminal is thus applicable in furthering pitch reduction and terminal addition.

The present invention may be arranged as in the following.

A connection terminal of the present invention may be such that a projecting electrode in an opening in layered protection films on an electrode pad, and arranged so that: the protection films are layered; a lower protection film has a larger opening therein than does an upper protection film; and the projecting electrode has a bottom extending under the upper protection film.

A semiconductor device of the present invention may be such that a projecting electrode is formed in an opening in a protection film on an electrode pad, and arranged so that: the protection films are layered; a lower protection film has a larger opening therein than does an upper protection film; and the projecting electrode has a bottom extending under the upper protection film.

In the arrangement of the connection terminal and semiconductor device, the protection films are layered, and the opening in a protection film on an electrode pad is arranged so that the opening in an upper protection film is smaller in size than the opening in a lower protection film. The arrangement, in electroless plating forming bumps, allows for no short between adjacent bumps and ensures sufficient adhesion area between a bump and the electrode pad, and thereby prevents adhesion strength from falling due to decreased bump width.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed:

1. A connection terminal, comprising:
   an electrode pad having layered protection films formed on a surface thereof; and
   a projecting electrode formed in an opening in the protection films on the electrode pad,
   wherein:
   a lower protection film has a larger opening therein than does an upper protection film; and
   the projecting electrode has a bottom extending under the upper protection film and has a top extending over the upper protection film.

2. The connection terminal of claim 1, wherein
   the projecting electrode is made of either an element selected from the group consisting of nickel, copper, palladium, gold, and tin or a compound containing one of the elements.

3. The connection terminal of claim 1, wherein
   the projecting electrode has a surface made of gold, palladium, or tin.

4. The connection terminal of claim 1, wherein
   the upper protection film is made of a silicon nitride film, and the lower protection film is made of a silicon oxide film.

5. The connection terminal of claim 1, wherein
   the opening in the lower protection film is of a size equal to, or smaller than, the electrode pad.

6. The connection terminal of claim 1, wherein the projecting electrode is for connection to an external wire.

7. A connection terminal, comprising:
   an electrode pad having layered protection films formed on a surface thereof; and
   a projecting electrode formed in an opening in the protection films on the electrode pad,
   wherein:

a lower protection film has a larger opening therein than does an upper protection film; and the projecting electrode has a bottom extending under the upper protection film, wherein the opening in the lower protection film has such a width that the projecting electrode exhibits an adhesion strength of more than 0.1 N.

8. The connection terminal of claim 7, wherein the projecting electrode is for connection to an external wire.

9. A connection terminal, comprising:

an electrode pad having layered protection films formed on a surface thereof; and a projecting electrode formed in an opening in the protection films on the electrode pad, wherein:

a lower protection film has a larger opening therein than does an upper protection film; and the projecting electrode has a bottom extending under the upper protection film, wherein the opening in the upper protection film has such a width that the projecting electrode is separated from adjacent projecting electrodes by a distance of 5 μm or greater.

10. The connection terminal of claim 9, wherein the projecting electrode is for connection to an external wire.

11. A semiconductor device, comprising at least one connection terminal comprising:

an electrode pad having layered protection films formed on a surface thereof; and a projecting electrode formed in an opening in the protection films on the electrode pad, wherein:

a lower protection film has a larger opening therein than does an upper protection film; and the projecting electrode has a bottom extending under the upper protection film and has a top extending over the upper protection film.

12. The semiconductor device of claim 11, wherein the projecting electrode is for connection to an external wire.

13. A connection terminal, comprising:

an electrode pad including layered protection films formed on a surface thereof; and a projecting electrode including a relatively upper portion and a relatively lower portion, and formed in an opening in the protection films on the electrode pad, wherein a lower protection film includes a relatively larger opening than an upper protection film, wherein the relatively lower portion of the projecting electrode extends under the upper protection film and wherein the relatively lower portion is relatively smaller than the relatively upper portion, and wherein the projecting electrode is for connection to an external wire.

14. A semiconductor device, comprising:

at least one connection terminal, the at least one connection terminal including, an electrode pad including layered protection films formed on a surface thereof; and a projecting electrode including a relatively upper portion and a relatively lower portion, and formed in an opening in the protection films on the electrode pad, wherein a lower protection film includes a relatively larger opening than an upper protection film, and wherein the relatively lower portion of the projecting electrode extends under the upper protection film, wherein the relatively lower portion is relatively smaller than the relatively upper portion and wherein the projecting electrode is for connection to an external wire.

15. A semiconductor device, comprising:

at least one connection terminal, the at least one connection terminal including, an electrode pad including layered protection films formed on a surface thereof; and a projecting electrode formed in an opening in the protection films on the electrode pad, wherein an upper protection film and a lower protection film have such an opening that the upper protection film overhangs the lower protection film and wherein the projecting electrode sandwiches an overhanging part of the upper protection film.

16. The semiconductor device of claim 15, wherein the projecting electrode is for connection to an external wire.

17. The connection terminal of claim 13, wherein the projecting electrode is for connection to an external wire.

* * * * *